(12) United States Patent
Gao et al.

(10) Patent No.: US 11,671,106 B2
(45) Date of Patent: Jun. 6, 2023

(54) PULSE SIGNAL GENERATION CIRCUIT AND METHOD, AND MEMORY

(71) Applicant: CHANGXIN MEMORY TECHNOLOGIES, INC., Hefei (CN)

(72) Inventors: Enpeng Gao, Hefei (CN); Weibing Shang, Hefei (CN); Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/649,181

(22) Filed: Jan. 27, 2022

(65) Prior Publication Data

US 2022/0158645 A1 May 19, 2022

Related U.S. Application Data

(63) Continuation of application No. PCT/CN2021/108544, filed on Jul. 27, 2021.

(30) Foreign Application Priority Data

Nov. 16, 2020 (CN) .......................... 202011279041.0

(51) Int. Cl.
*H03L 7/197* (2006.01)
*H03L 7/081* (2006.01)
*H03K 19/20* (2006.01)
*H03L 7/199* (2006.01)

(52) U.S. Cl.
CPC ........... *H03L 7/1976* (2013.01); *H03K 19/20* (2013.01); *H03L 7/0816* (2013.01); *H03L 7/0818* (2013.01); *H03L 7/199* (2013.01)

(58) Field of Classification Search
CPC ... H03L 7/1976; H03L 7/0816; H03L 7/0818; H03L 7/199; H03K 19/20
See application file for complete search history.

(56) References Cited

U.S. PATENT DOCUMENTS

| | | | |
|---|---|---|---|
| 6,680,874 | B1 | 1/2004 | Harrison |
| 6,842,399 | B2 | 1/2005 | Harrison |
| 9,024,668 | B1 * | 5/2015 | Baek ........................ H03K 5/06 327/159 |
| 9,461,658 | B1 * | 10/2016 | Perrott .................. H03L 7/0802 |
| 9,973,178 | B1 * | 5/2018 | Holzmann ......... H03K 5/00006 |

(Continued)

FOREIGN PATENT DOCUMENTS

| | | | |
|---|---|---|---|
| CN | 201804106 U | 4/2011 | |
| CN | 206164491 U | 5/2017 | |

(Continued)

*Primary Examiner* — Adam D Houston
(74) *Attorney, Agent, or Firm* — Syncoda LLC; Feng Ma

(57) ABSTRACT

A pulse signal generation circuit includes a clock frequency division component, a time delay component and a selection component. The clock frequency division component is configured to perform frequency division on a clock signal to generate a clock frequency division signal; the time delay component is configured to generate a time delay signal based on the clock frequency division signal; and the selection component is configured to receive the clock frequency division signal and the time delay signal at the same time, and select the clock frequency division signal and the time delay signal according to a preset condition to generate a pulse signal.

17 Claims, 8 Drawing Sheets

(56) References Cited

U.S. PATENT DOCUMENTS

| | | | |
|---|---|---|---|
| 10,156,603 B1* | 12/2018 | Fu | G01R 31/31937 |
| 10,924,119 B1* | 2/2021 | Tak | H03L 7/1075 |
| 10,944,407 B1* | 3/2021 | Soni | H03L 7/0818 |
| 11,277,140 B1* | 3/2022 | Park | H03L 7/091 |
| 2004/0076055 A1 | 4/2004 | Harrison | |
| 2009/0086511 A1* | 4/2009 | Lin | H02M 3/07 |
| | | | 363/21.01 |
| 2010/0134162 A1* | 6/2010 | Kondou | G01R 31/31727 |
| | | | 327/158 |
| 2010/0141319 A1* | 6/2010 | Marutani | H03L 7/00 |
| | | | 327/170 |
| 2016/0182056 A1* | 6/2016 | Mumper | H03K 19/1737 |
| | | | 327/115 |
| 2016/0269012 A1* | 9/2016 | Takahashi | H03L 7/087 |
| 2018/0302097 A1* | 10/2018 | Guo | H03L 7/087 |
| 2019/0212703 A1* | 7/2019 | Yao | H03L 7/099 |
| 2020/0220550 A1* | 7/2020 | Aga | H03L 7/0891 |
| 2020/0266806 A1* | 8/2020 | Nakajima | H03L 7/1974 |
| 2020/0393868 A1* | 12/2020 | Oh | H03K 3/017 |
| 2021/0026400 A1* | 1/2021 | Kamiyama | H03K 5/065 |
| 2021/0065782 A1* | 3/2021 | Miyano | H03L 7/0812 |
| 2021/0305989 A1* | 9/2021 | Han | H03K 5/131 |
| 2022/0052678 A1* | 2/2022 | Choi | H03L 7/0816 |
| 2022/0158645 A1* | 5/2022 | Gao | H03L 7/199 |
| 2022/0224348 A1* | 7/2022 | Perrott | H03M 1/0687 |

FOREIGN PATENT DOCUMENTS

| | | | |
|---|---|---|---|
| CN | 111049504 A | 4/2020 | |
| EP | 3567724 A1 * | 11/2019 | H03L 7/0805 |
| EP | 4125212 A1 * | 2/2023 | H03K 19/20 |
| KR | 102268767 B1 * | 6/2021 | |

* cited by examiner

PULSE SIGNAL GENERATION CIRCUIT AND METHOD, AND MEMORY

CROSS-REFERENCE TO RELATED APPLICATIONS

This is a continuation of International Patent Application No. PCT/CN2021/108544 filed on Jul. 27, 2021, which claims priority to Chinese Patent Application No. 202011279041.0 filed on Nov. 16, 2020. The disclosures of these applications are hereby incorporated by reference in their entirety.

BACKGROUND

Taking a Dynamic Random-Access Memory (DRAM) as an example, when a memory performs access action, it needs to generate a series of control signals, which are usually pulse signals with a certain width.

The effective level width of the control pulse signals seriously affects the performance of the memory. If the width is too wide, the access speed of the memory may decrease, and if the width is too narrow, the internal operations of the memory may not be completed. Therefore, it is necessary to reasonably control the effective level width of the pulse signal to ensure a good access performance of the memory.

It is to be noted that information disclosed in the background part is merely used for enhancing understanding of the background of the disclosure, so that information, which does not constitute the conventional art known by those of ordinary skill in the art, may be included.

SUMMARY

The purpose of the disclosure is to overcome the disadvantages of the related art. The disclosure relates to the technical field of semiconductors, and in particular to a pulse signal generation circuit and method, and a memory including the pulse signal generation circuit.

According to a first aspect of the disclosure, a pulse signal generation circuit is provided, which includes a clock frequency division component, a time delay component and a selection component.

An input end of the clock frequency division component receives a clock signal, and the clock frequency division component is configured to perform frequency division on the clock signal to generate a clock frequency division signal. An input end of the time delay component is connected to an output end of the clock frequency division component, and the time delay component is configured to generate a time delay signal based on the clock frequency division signal. Input ends of the selection component are respectively connected to the output end of the clock frequency division component and an output end of the time delay component. The selection component is configured to receive the clock frequency division signal and the time delay signal at the same time, and perform selection on the clock frequency division signal and the time delay signal according to a preset condition to generate the pulse signal.

According to a second aspect of the disclosure, a pulse signal generation method is provided, which includes the following operations.

A clock signal is provided. Frequency division on the clock signal is performed by the clock frequency division component to generate a clock frequency division signal. A time delay signal is generated by a time delay component based on the clock frequency division signal. The clock frequency division signal and the time delay signal are received by a selection component, and selection is performed on the clock frequency division signal and the time delay signal according to a preset condition to generate the pulse signal.

According to a third aspect of the disclosure, a memory is provided, which includes the pulse signal generation circuit as described above.

BRIEF DESCRIPTION OF THE DRAWINGS

The accompanying drawings here, which are incorporated in and constitute a part of this specification, illustrate embodiments consistent with the disclosure and, together with the description, serve to explain the principles of the disclosure. It is apparent that the drawings described below are only some embodiments of the disclosure. Other drawings may further be obtained by those of ordinary skilled in the art according to these drawings without creative work.

Figure 1:
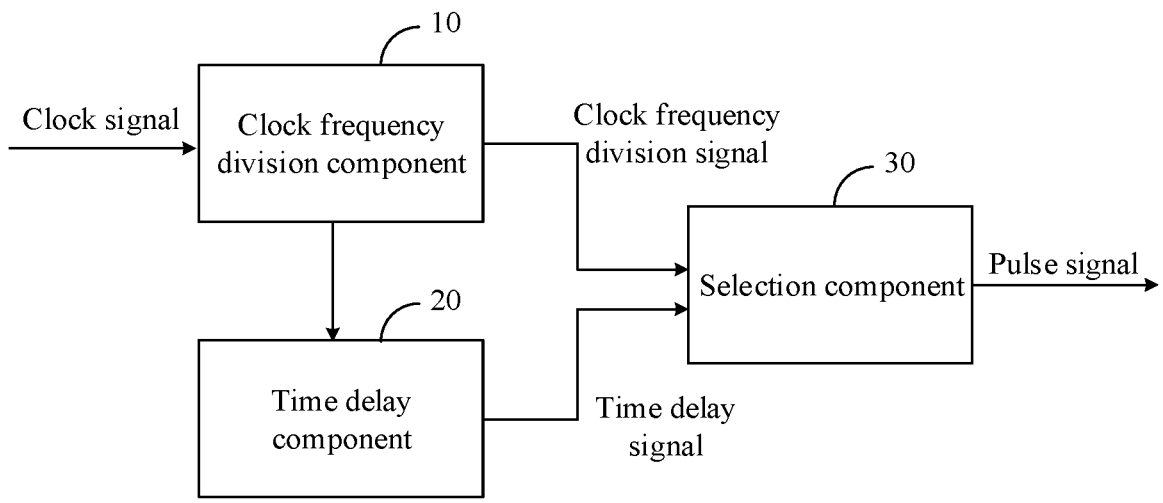
FIG. 1 is a schematic structural diagram of a pulse signal generation circuit according to some implementation modes of the disclosure.

Reference numerals in the drawings are as follows. 10. Clock frequency division component; 20. Time delay component; 21. Setting circuit; 22. Trigger; 23. Time delay circuit; 24. Reset circuit; 40. Signal driving circuit; 30. Selection component; 40. Phase adjusting circuit; 50. Signal driving circuit; 60. Command input component; 70. Command decoding circuit; 80. Command latch circuit.

DETAILED DESCRIPTION

Exemplary embodiments will now be described more fully with reference to the drawings. However, the exemplary embodiments may be implemented in many forms, and should not be understood as limitation to embodiments described herein. On the contrary, these provided embodiments enable the disclosure to be more comprehensive and complete, and conceptions of the exemplary embodiments are fully conveyed to those skilled in the art. The same signs in the drawings represent same or similar structures, and thus detailed descriptions thereof are omitted.

For the memory with higher performance requirements and smaller size, the pulse signal generation circuits are difficult to meet the demand.

A suitable pulse signal is the necessary premise to realize the access actions inside a memory. One generation method of a pulse signal is to perform frequency division on a clock signal. The effective level width of the pulse signal obtained by the method is constrained by the period of the clock signal. As process nodes of the memory become smaller and smaller and the storage speed becomes faster and faster, so the constrained effective level width is difficult to meet the actual demand.

Embodiments of the disclosure provide a pulse signal generation circuit. As shown in FIG. 1, the pulse signal generation circuit in the embodiments of the disclosure includes a clock frequency division component 10, a time delay component 20 and a selection component 30. An input end of the clock frequency division component 10 receives a clock signal, and the clock frequency division component 10 is configured to perform frequency division on the clock signal to generate a clock frequency division signal. An input end of the time delay component 20 is connected with an output end of the clock frequency division component 10, and the time delay component 20 is configured to generate a time delay signal based on the clock frequency division signal. Input ends of the selection component 30 are respectively connected with the output end of the clock frequency division component 10 and an output end of the time delay component 20. The selection component 30 is configured to receive the clock frequency division signal and the time delay signal at the same time, and to perform selection operation on the clock frequency division signal and the time delay signal according to a preset condition to generate a pulse signal.

Based on the above circuit structure, the period of the pulse signal is established based on the period of the clock signal, and is consistent with the frequency-divided clock signal. Therefore, the pulse signal meets the requirements of a synchronous circuit. The effective level width of the pulse signal may be selected according to demands, which avoids the situation that it is difficult to meet the actual demands by simply relying on the clock frequency division signal. On the premise that both the period and the width of the pulse signal may meet the demands, the effective level width of the pulse signal of the disclosure is more controllable, so that the memory has good access performance.

The pulse signal generation circuit according to the embodiments of the disclosure is described in detail below.

The clock frequency division component 10 is configured to reduce the frequency of the clock signal to 1/N of that of the clock signal. Its purpose is to make the periods of the subsequent clock frequency division signal and time delay signal be established based on the period of the clock signal. Therefore, it is not necessary to separately set a circuit for synchronization with the clock signal, which saves the area of the circuit structure.

Herein, if N is even, it is even frequency division, and if N is odd, it is odd frequency division. For example, when N=2, the clock frequency division component 10 is a two-frequency-division clock frequency division circuit, and the clock frequency division component 10 outputs a periodic signal when a clock triggers two periods every time. Either even frequency division or odd frequency division may be realized by a counter. For example, an even clock frequency division component may be composed of a counter, an inverter and a trigger, and its working principle is to take input clock signals of a clock source as counting pulses. Because the output end of the counter outputs pulses according to a certain rule, the signal pulses output by different ports may be regarded as the frequency division of the input signal. The working process of frequency division is determined by the selected counter. Thus, if a binary counter is selected, it is a two-frequency-division clock circuit; if an eight-frequency-division counter is selected, it is an eight-frequency-division clock circuit, and so on. Therefore, when the counter is full, it will send an enable signal to the trigger 22. After receiving the enable signal, the trigger will receive a source clock signal processed by the inverter, and finally, the trigger will output the final frequency division clock. In some circuit systems, there may be a demand for non-integer frequency division on the clock signal, and at this time, a phase-locked loop circuit may be used to realize the non-integer frequency division on the clock. In the embodiment, the clock frequency division signal output from the output end of the clock frequency division component 10 is divided into two channels, one is transmitted to the selection component 30, and the other is transmitted to the time delay component 20.

The time delay component 20 generates a time delay signal based on the clock frequency division signal, which means that the time delay component 20 uses a rising edge of the clock frequency division signal as a rising edge of the time delay signal, delays the rising edge for a certain time, and generates a falling edge, thereby generating the time delay signal. That is, the time delay signal is generated based on the clock frequency division signal, and its period is based on the period of the clock signal. In some technical data, "time delay" is also referred to as "delay". In the disclosure, "time delay" and "delay" mean the same.

Figure 2:
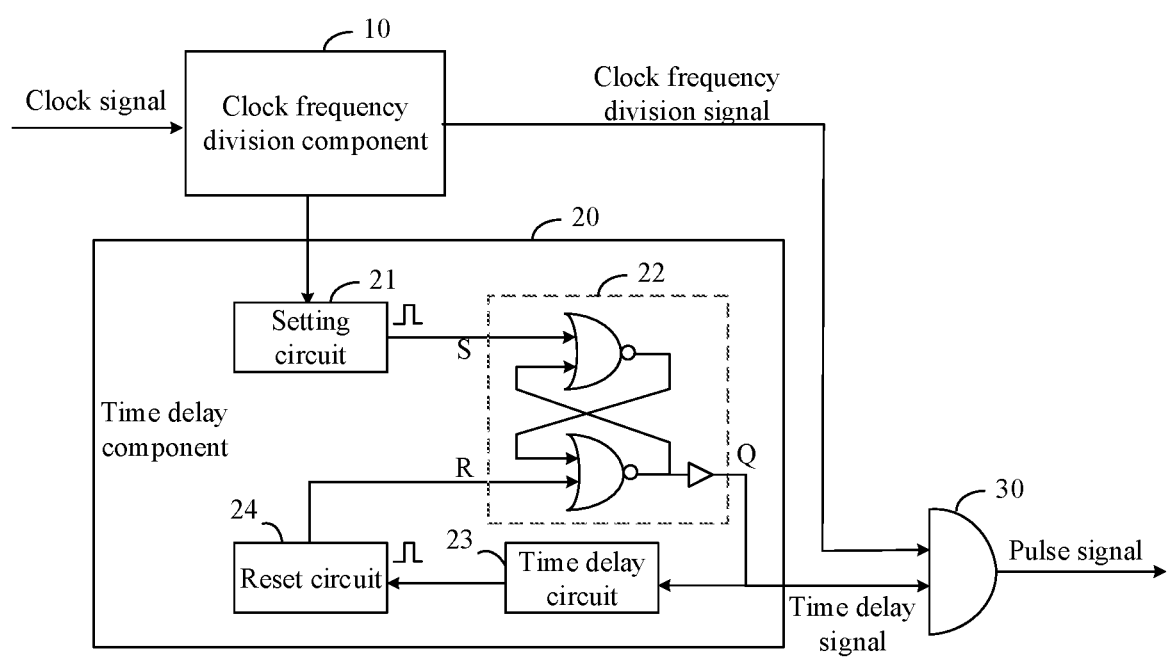
FIG. 2 is a schematic structural diagram of a pulse signal generation circuit in an embodiment of the disclosure.

In some embodiments, referring to FIG. 2, the time delay component 20 includes a setting circuit 21, a trigger 22, a time delay circuit 23 and a reset circuit 24, which are sequentially connected in series. An input end of the setting circuit 21 is connected to the output end of the clock frequency division component 10, and the setting circuit 21 is configured to generate a setting pulse in response to receiving the rising edge of the clock frequency division signal from the clock frequency division component 10. An input end of the trigger 22 is connected to the output end of the setting circuit 21, the output end of the trigger 22 is the output end of the time delay component 20, and the trigger 22 is configured to output the triggering level in response to receiving the setting pulse generated by the setting circuit 21. An input end of the time delay circuit 23 is connected to the output end of the trigger 22, and the time delay circuit 23 is configured to delay the triggering level output by the trigger 22 and output the delayed triggering level. An input end of the reset circuit 24 is connected to the output end of the time delay circuit 23, the output end of the reset circuit 24 is connected to the input end of the trigger 22, and the reset circuit 24 is configured to output a reset pulse in response to receiving the rising edge of the delayed triggering level.

In some embodiments, the trigger 22 adopts a reset/set trigger, that is, RS trigger. The input and output ends of two NOR gates (or NAND gates) are in cross connection to form a basic RS trigger. As shown in FIG. 2, it is an RS trigger having reset and set functions and composed of two NOR gates in cross coupling. Its input end S is connected to the output end of the setting circuit 21, the input end R is connected to the output end of the reset circuit 24, and the output end Q is the output end of the NOR gate connected to the input end R.

The setting circuit 21 outputs a setting pulse upon receiving the rising edge of the clock frequency division signal. At this time, the output end Q of the RS trigger outputs 1, that is, a rising edge of a triggering level is generated. The rising edge is delayed by the time delay circuit 23 for a period of time to form a high-level signal with a certain width, and then output the same to the reset circuit. The reset circuit 24 outputs a reset pulse upon receiving the rising edge of the triggering level delayed by the time delay circuit 23. At this time, the output end Q of the RS trigger outputs 0, that is, a falling edge of the triggering level is generated. The falling edge is delayed by the time delay circuit 23 for a period of time to form a low-level signal with a certain width. When the setting circuit 21 receives the rising edge of the clock frequency division signal again, it outputs 1 again, and the process cycles, thereby to form a square wave pulse signal with a certain effective level width, that is, a time delay signal.

The time delay circuit 23 may be realized by any circuit structure that may realize the time delay function., for example, an even number of connected inverters may be adopted and some capacitors may also be included, or the time delay circuit 23 may also be realized by a buffer(s), which is not specially limited in the disclosure. The effective level width of the time delay signal is determined by time delay parameters of the time delay circuit 23, and the time delay parameters may be adjusted as needed. In some embodiments, the time delay circuit 23 is a fixed time delay circuit, which means that the time of each delay is equal, and thus it is a fixed time delay. In other embodiments, the time delay circuit 23 may also be a variable time delay circuit, that is, the time of each delay may be different. The setting circuit 21 and the reset circuit 24 may adopt the same circuit structure, or they may also be different circuit structures.

In some embodiments, the preset condition for the selection component to select the clock frequency division signal and the time delay signal is as follows. The later rising edge in the rising edges of the clock frequency division signal and the time delay signal is selected as the rising edge of the pulse signal, and the earlier falling edge in the falling edges of the clock frequency division signal and the time delay signal is selected as the falling edge of the pulse signal, so as to generate a pulse signal. Therefore, the selection component 30 may include an AND gate, the first input end of which is connected to the output end of the clock frequency division component 10, and the second input end of which is connected to the output end of the trigger 22. Only when the clock frequency division signal and the time delay signal are at high level, the AND gate will output a high level, otherwise it will output a low level.

The mode of generating a pulse signal by the above circuit structure is described in detail below in combination with the timing sequence diagrams.

Figure 3:
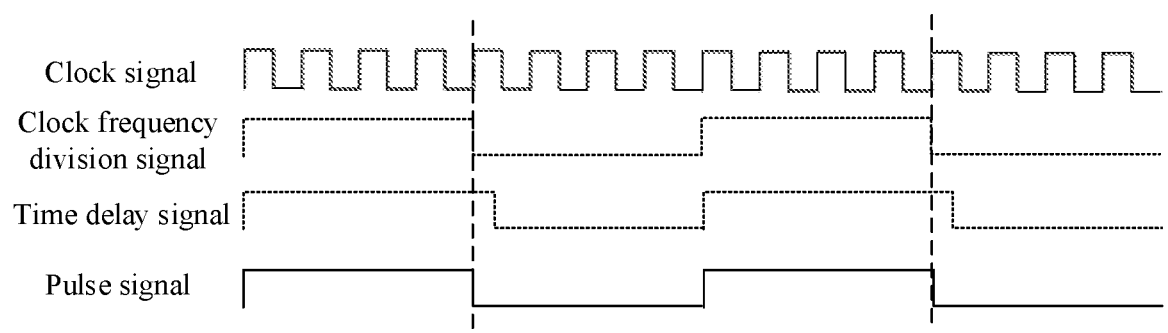
FIG. 3 is a timing sequence comparison diagram of various signals in the first embodiment of the disclosure.

For example, FIG. 3 illustrates timing sequence diagrams of a clock signal, a clock frequency division signal, a time delay signal and a pulse signal. Herein, the clock frequency division component 10 performs eight frequency divisions on the clock signal, so that the period of the clock frequency division signal and the period of the time delay signal are eight times of the period of the clock signal, and the time delay circuit is a fixed time delay circuit. In some embodiments, the rising edges of the clock frequency division signal and the time delay signal are synchronized. At this time, the AND gate synchronously receives the rising edges of the clock frequency division signal and the time delay signal and outputs a high level. The effective level width of the clock frequency division signal is less than the effective level width of the time delay signal, and thus the falling edge of the clock frequency division signal arrives earlier than the falling edge of the time delay signal. At this time, the AND gate outputs a low level upon receiving the falling edge of the clock frequency division signal. Therefore, the effective level width of the pulse signal output by the AND gate is equal to that of the clock frequency division signal.

Figure 4:
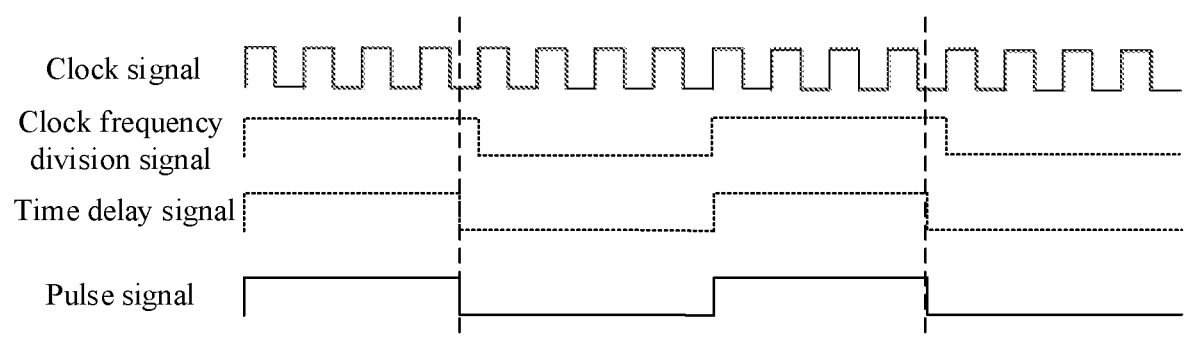
FIG. 4 is a timing sequence comparison diagram of various signals in the second embodiment of the disclosure.

For another example, referring to FIG. 4, unlike FIG. 3, the effective level width of the clock frequency division signal is greater than that of the time delay signal. The rising edges of the clock frequency division signal and the time delay signal are synchronized. At this time, the AND gate synchronously receives the rising edges of the clock frequency division signal and the time delay signal and outputs a high level. The effective level width of the clock frequency division signal is greater than the effective level width of the time delay signal, and thus the falling edge of the time delay signal arrives earlier than the falling edge of the clock frequency division signal. At this time, the AND gate outputs a low level upon receiving the falling edge of the time delay signal. Therefore, the effective level width of the pulse signal output by the AND gate is equal to that of the time delay signal.

In the examples shown in FIG. 3 and FIG. 4, the rising edges of the clock frequency division signal and the time delay signal are synchronized, which may ensure that the pulse signal may be easily modulated by the clock signal. However, for some practical circuits, considering the factors such as process, and circuit characteristics, there will be a period of time from the time when the clock frequency division signal reaches the setting circuit 21 to the time when the new state at the output end of the trigger 22 is stably established. The elapsed time is the transmission delay time of the trigger 22. When the transmission delay time is relatively large, the rising edge of the time delay signal is not synchronized with the rising edge of the clock frequency division signal, and is later than the rising edge of the clock frequency division signal.

Figure 5:
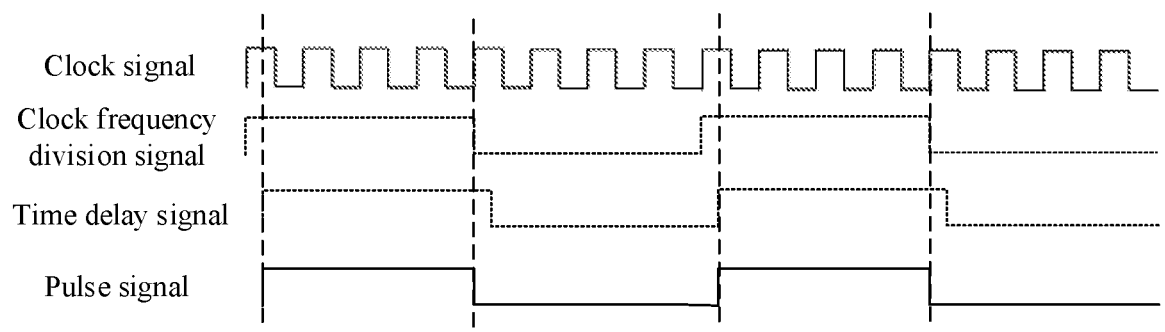
FIG. 5 is a timing sequence comparison diagram of various signals in the third embodiment of the disclosure.

For example, referring to FIG. 5, the rising edge of the clock frequency division signal arrives earlier than the rising edge of the time delay signal, and the AND gate outputs a high level only when receiving the rising edge of the time delay signal. The falling edge of the clock frequency division signal also arrives earlier than the falling edge of the time delay signal, and the AND gate outputs a low level upon receiving the falling edge of the clock frequency division signal. As a result, the effective level width of the pulse signal output by the AND gate is the width from the rising edge of the time delay signal to the falling edge of the clock frequency division signal.

Figure 6:
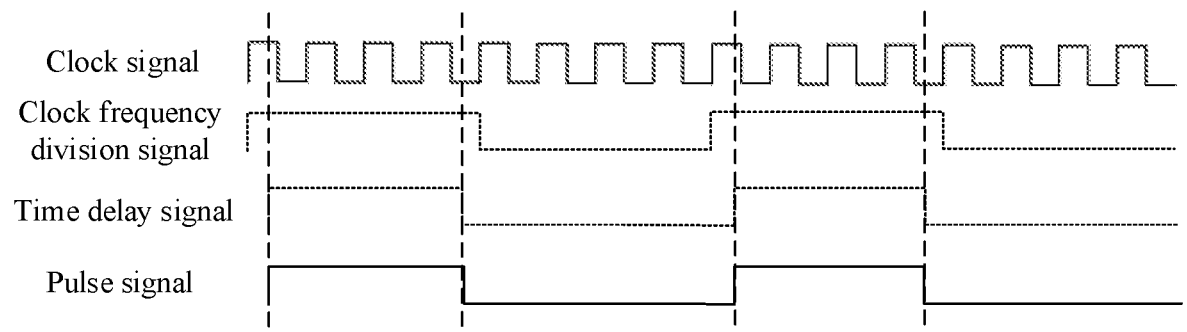
FIG. 6 is a timing sequence comparison diagram of various signals in the fourth embodiment of the disclosure.

For another example, referring to FIG. 6, the rising edge of the clock frequency division signal arrives earlier than the rising edge of the time delay signal, and the AND gate outputs a high level only when receiving the rising edge of the time delay signal. The falling edge of the time delay signal arrives earlier than the falling edge of the clock frequency division signal, and the AND gate outputs a low level upon receiving the falling edge of the time delay signal. Therefore, the effective level width of the pulse signal output by the AND gate is the width from the rising edge of the time delay signal to the falling edge of the time delay signal, that is, the effective level width of the pulse signal output by the AND gate is equal to the effective level width of the time delay signal.

The embodiments of FIG. 3 to FIG. 6 show different selection processes under a preset condition. In other embodiments, the preset condition may also be other conditions, for example, the earlier rising edge in the rising edges of the clock frequency division signal and the time delay signal is selected as the rising edge of the pulse signal, and the later falling edge in the falling edges of the clock frequency division signal and the time delay signal is selected as the falling edge of the pulse signal to generate the pulse signal. In short, the preset condition may be set according to the requirements of the memory for the effective level width of the pulse signal, so that the selection component may select suitable rising edge and falling edge.

Figure 7:
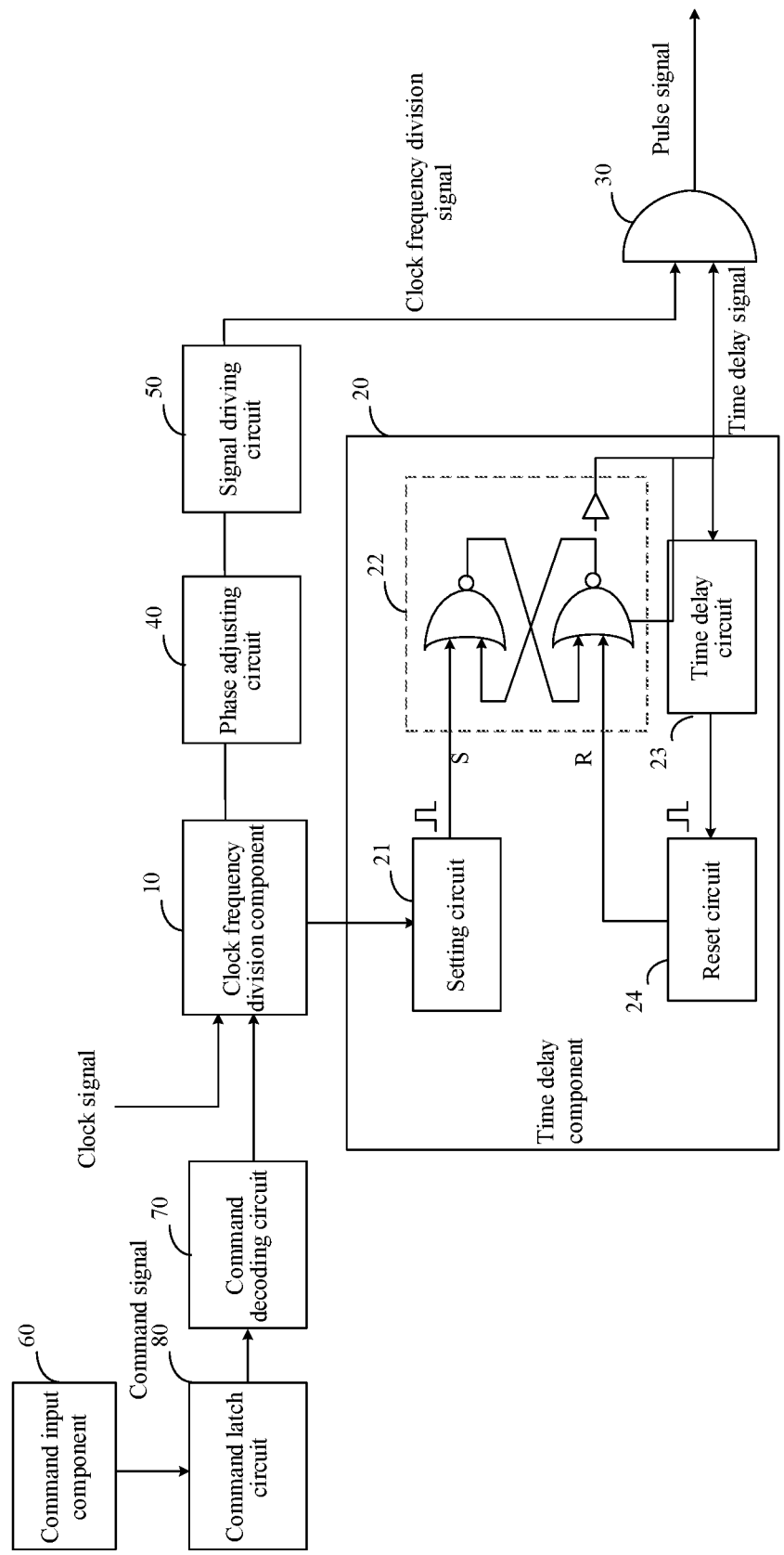
FIG. 7 is a schematic structural diagram of a pulse signal generation circuit in another embodiment of the disclosure.

Continuing with the examples of FIG. 5 and FIG. 6, since the rising edges of the clock frequency division signal and the time delay signal are not synchronized, the pulse signal output from the AND gate will not be synchronized with the clock signal, thereby affecting the access performance. Therefore, the ideal way is to synchronize the rising edges of the clock frequency division signal and the time delay signal. In order to avoid the problem, a phase adjusting circuit 40 is also added into the pulse signal generation circuit of the embodiments of the disclosure. Referring to FIG. 7, the input end of the phase adjusting circuit 40 is connected with the output end of the clock frequency division component 10, and the output end of the phase adjusting circuit 40 is connected with the input end of the selection component 30. The phase adjusting circuit 40 is configured to adjust the phase of the clock frequency division signal, so as to synchronize the rising edges of the clock frequency division signal and the time delay signal. The rising edge of the time delay signal is later than the rising edge of the clock frequency division signal due to the transmission delay time, so the phase adjusting circuit 40 may adjust the phase of the clock frequency division signal backward to synchronize the rising edge of the clock frequency division signal with the rising edge of the time delay signal. The phase adjusting circuit 40 may specifically include an inverter and adjusts the phase of the clock signal by using the delay generated by the inverter.

After adjustment, the selection component 30 may select the rising edge of the clock frequency division signal or the time delay signal as the rising edge of the pulse signal, and then select the earlier falling edge in the falling edges of the clock frequency division signal and the time delay signal as the falling edge of the pulse signal, to generate the pulse signal. It can also be understood that, the selection component 30 selects a clock frequency division signal or a time delay signal as a pulse signal to output. Then, the effective level width of the pulse signal may select the effective level width of the clock frequency division signal or the time delay signal according to demands, which avoids the situation that it is difficult to meet the actual demands simply relying on the clock frequency division signal. The period of the pulse signal generated by the solution is established based on the period of the clock signal and meets the requirements of a synchronous circuit. On the premise that both the period and the width of the pulse signal meet the demand, the effective level width of the pulse signal is more controllable, so that the memory has good access performance.

In the above embodiments, eight frequency division is taken as an example and the fixed time delay is described. It can be understood by those skilled in the art that, when the clock frequency division component 10 performs frequency division by other multiples and the time delay circuit adopts the variable time delay circuit, the generation of the pulse signal may also be achieved through the same idea.

Further, referring to FIG. 7, the pulse signal generation circuit of the embodiments may also include a signal driving circuit 50. The input end of the signal driving circuit 50 is connected with the output end of the phase adjusting circuit 40, and the output end of the signal driving circuit 50 is connected with the input end of the selection component 30, so that the selection component 30 may accurately receive the clock frequency division signal.

Further, referring to FIG. 7, the pulse generation circuit of the embodiments may also include a command input component 60. The command input component 60 is configured to provide a command signal to the clock frequency division component 10, so that the clock frequency division component 10 performs frequency division on the clock signal according to the command signal. Therefore, the output end of the command input component 60 is connected to the input end of the clock frequency division component 10. The command input component 60 may be a command receiver, which is configured to receive an external command.

Further, referring to FIG. 7, the pulse generation circuit of the embodiments may also include a command decoding circuit 70. Since the command signal is usually an encoded command, the command decoding circuit 70 is configured to decode the command signal, so that the clock frequency division component 10 performs frequency division on the clock signal according to the decoded command signal. Therefore, the input end of the command decoding circuit 70 is connected to the output end of the command input component 60, and the output end of the command decoding circuit 70 is connected to the input end of the clock frequency division component 10.

Further, referring to FIG. 7, the pulse generation circuit of the embodiments may also include a command latch circuit 80, which is configured to latch a command signal. Therefore, the input end of the command latch circuit 80 is connected to the output end of the command input component 60, and the output end of the command latch circuit 80 is connected to the input end of the command decoding circuit 70.

Figure 8:
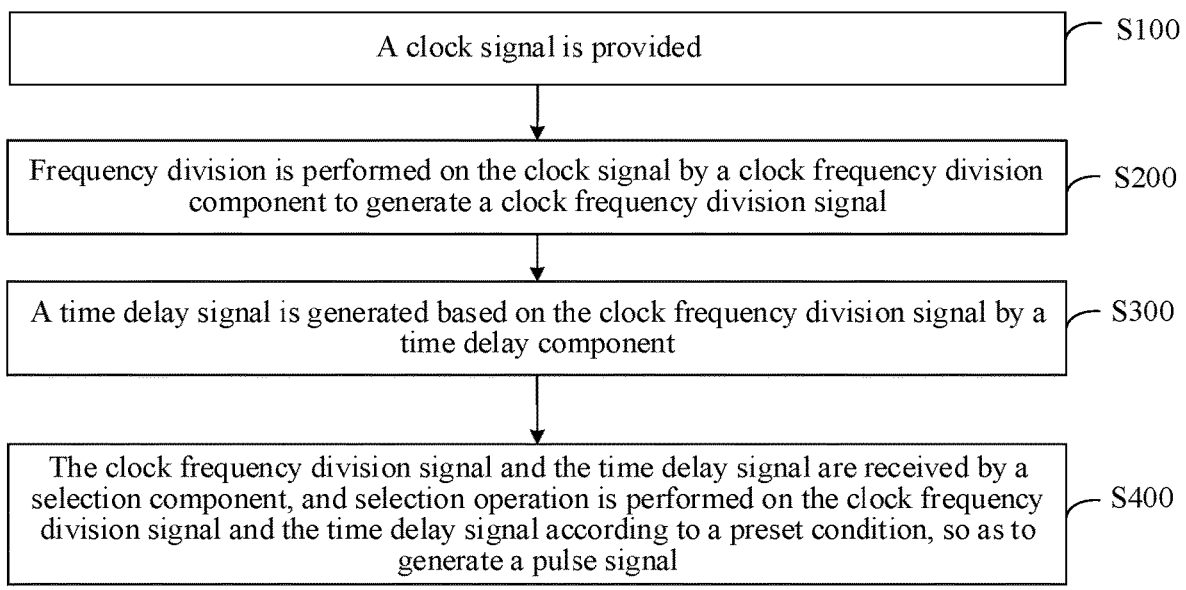
FIG. 8 is a flowchart of a pulse signal generation method according to some implementation modes of the disclosure.

In combination with the above circuit structure, FIG. 8 illustrates a pulse signal generation method according to the embodiments of the disclosure, which includes the following operations.

At S100, a clock signal is provided.

At S200, frequency division is performed on the clock signal by a clock frequency division component 10 to generate a clock frequency division signal.

At S300, a time delay signal is generated by a time delay component 20 based on the clock frequency division signal.

In the operations, the circuit structure shown in FIG. 2 may be adopted, and the corresponding method includes the following operations. A setting circuit 21 is utilized to output a setting pulse in response to receiving the rising edge of the clock frequency division signal; a trigger 22 is utilized to output a triggering level in response to receiving the setting pulse; a time delay circuit 23 is utilized to delay the triggering level and output a delayed triggering level; and a reset circuit 24 is utilized to output a reset pulse in response to receiving the rising edge of the delayed triggering level, so as to generate a time delay signal. In order to synchronize the rising edges of the clock frequency division signal and the time delay signal, the above method may also include: adjusting the phase of the clock frequency division signal output by the clock frequency division component 10 by using the phase adjusting circuit 40 to synchronize the rising edges of the clock frequency division signal and the time delay signal.

At S400, the clock frequency division signal and the time delay signal are received by a selection component 30 at the same time, and selection operation is performed on the clock frequency division signal and the time delay signal according to a preset condition to generate the pulse signal.

As mentioned above, the preset condition may be as follows. The clock frequency division signal and the time delay signal are compared, the later rising edge in the rising edges of the clock frequency division signal and the time delay signal is selected as the rising edge of the pulse signal, and the earlier falling edge in the falling edges of the clock frequency division signal and the time delay signal is selected as the falling edge of the pulse signal, so as to generate the pulse signal. For example, when the rising edges of the clock frequency division signal and the time delay signal are synchronized, the selection component 30 may select the rising edge of the clock frequency division signal or the time delay signal as the rising edge of the pulse signal, and select the earlier falling edge in the falling edges of the clock frequency division signal and the time delay signal as the falling edge of the pulse signal, so as to generate the pulse signal The preset condition may also be other conditions, for which details may refer to the abovementioned descriptions and will not be elaborated here.

Besides the above operations, the method may also include a plurality of operations, such as inputting a frequency division command signal by the command input component, or decoding the command signal by the command decoding circuit, or latching the command signal by the command latch circuit, or amplifying the clock frequency division signal by the signal driving circuit, so as to make the generated pulse signal better.

The embodiments of the disclosure further provide a memory, which may include the abovementioned pulse signal generation circuit, and thus it has good access performance. The memory may include, but is not limited to, a DRAM, a Synchronous Dynamic Random-Access Memory (SDRAM), a Double Data Rate SDRAM (DDR SDRAM) and other memories.

In the disclosure, the effective level width of the pulse signal generated by the pulse signal generation circuit may be controlled based on the time delay time and the multiple of the external clock period at the same time, so as to avoid the situation that the effective level width cannot fully meet the demand simply by relying on the clock signal to generate pulses. Meanwhile, the period of the pulse signal of the disclosure is established based on the period of the clock signal and meets the requirements of a synchronous circuit. On the premise that both the period and the width of the pulse signal meet the demand, the effective level width of the pulse signal of the disclosure is more controllable, so that the memory has good access performance.

It is to be understood that the above general descriptions and detail descriptions below are merely exemplary and explanatory, which may not limit the disclosure.

It should be understood by those skilled in the art that the terms "unit", "module" or "component" used in the disclosure can be implemented as hardware circuits or other hardware parts in practical applications. For example, the clock frequency division component may be a clock frequency division circuit, the time delay component may be a time delay circuit, and the selection component may be a selection circuit, and so on.

In the disclosure, terms "one", "a/an", "the", "said", "described" and "at least one" are used to indicate one or more elements/constituent parts etc. Terms "include" and "have" are used to express an open sense of inclusion and to indicate that additional elements/constituents and the like may exist in addition to the listed elements/constituents and the like.

Other implementation solutions of the disclosure will be apparent to those skilled in the art from consideration of the specification and practice of the disclosure disclosed herein. The disclosure is intended to contain any modification, purpose or adaptive change of the disclosure, and they follow general principles of the disclosure and include common general knowledge or conventional technical means in the technical field, which is not disclosed by the disclosure. The specification and the embodiments are considered exemplary only, and the true scope and spirit of the disclosure are indicated by the appended claims.

What is claimed is:

1. A pulse signal generation circuit, comprising:
   a clock frequency division component, wherein an input end of the clock frequency division component receives a clock signal, and the clock frequency division component is configured to perform frequency division on the clock signal to generate a clock frequency division signal;
   a time delay component, wherein an input end of the time delay component is connected to an output end of the clock frequency division component, and the time delay component is configured to generate a time delay signal based on the clock frequency division signal; and
   a selection component, wherein input ends of the selection component are respectively connected to the output end of the clock frequency division component and an output end of the time delay component, and the selection component is configured to receive the clock frequency division signal and the time delay signal at the same time, and perform selection on the clock frequency division signal and the time delay signal according to a preset condition to generate a pulse signal.

2. The pulse signal generation circuit according to claim 1, wherein the preset condition is as follows: selecting a later rising edge in a rising edge of the clock frequency division signal and a rising edge of the time delay signal as a rising edge of the pulse signal, and selecting an earlier falling edge in a falling edge of the clock frequency division signal and a falling edge of the time delay signal as a falling edge of the pulse signal.

3. The pulse signal generation circuit according to claim 2, wherein the time delay component comprises:
   a setting circuit, wherein an input end of the setting circuit is connected to the output end of the clock frequency division component, and the setting circuit is configured to output a setting pulse in response to receiving the rising edge of the clock frequency division signal;
   a trigger, wherein an input end of the trigger is connected to an output end of the setting circuit, and an output end of the trigger is the output end of the time delay component, and wherein the trigger is configured to output a triggering level in response to receiving the setting pulse;
   a time delay circuit, wherein an input end of the time delay circuit is connected to the output end of the trigger, and the time delay circuit is configured to delay the triggering level and output a delayed triggering level; and
   a reset circuit, wherein an input end of the reset circuit is connected to an output end of the time delay circuit, and an output end of the reset circuit is connected to the input end of the trigger, and wherein the reset circuit is configured to output a reset pulse in response to receiving a rising edge of the delayed triggering level.

4. The pulse signal generation circuit according to claim 3, wherein the time delay circuit is a fixed time delay circuit.

5. The pulse signal generation circuit according to claim 3, wherein the trigger is a reset/set (RS) trigger.

6. The pulse signal generation circuit according to claim 3, wherein the selection component comprises an AND gate, wherein a first input end of the AND gate is connected to the output end of the clock frequency division component, and a second input end of the AND gate is connected to the output end of the trigger.

7. The pulse signal generation circuit according to claim 1, wherein the clock frequency division component is frequency divided by an even number.

8. The pulse signal generation circuit according to claim 1, further comprising:
a phase adjusting circuit, wherein an input end of the phase adjusting circuit is connected to the output end of the clock frequency division component, and an output end of the phase adjusting circuit is connected to the input end of the selection component, and wherein the phase adjusting circuit is configured to adjust a phase of the clock frequency division signal to synchronize a rising edge of the clock frequency division signal and a rising edge of the time delay signal;
wherein the selection component is further configured to: select the rising edge of the clock frequency division signal or the rising edge of the time delay signal as a rising edge of the pulse signal, and select an earlier falling edge in a falling edge of the clock frequency division signal and a falling edge of the time delay signal as a falling edge of the pulse signal, to generate the pulse signal.

9. The pulse signal generation circuit according to claim 8, further comprising:
a signal driving circuit, wherein an input end of the signal driving circuit is connected to the output end of the phase adjusting circuit, and an output end of the signal driving circuit is connected to the input end of the selection component.

10. The pulse signal generation circuit according to claim 1, further comprising:
a command input component, wherein an output end of the command input component is connected to the input end of the clock frequency division component, and the command input component is configured to provide a command signal to the clock frequency division component so that the clock frequency division component performs frequency division on the clock signal according to the command signal.

11. The pulse signal generation circuit according to claim 10, further comprising:
a command decoding circuit, wherein an input end of the command decoding circuit is connected to the output end of the command input component, and an output end of the command decoding circuit is connected to the input end of the clock frequency division component, and wherein the command decoding circuit is configured to decode the command signal to obtain a command signal so that the clock frequency division component performs frequency division on the clock signal according to the decoded command signal.

12. The pulse signal generation circuit according to claim 11, further comprising:
a command latch circuit, wherein an input end of the command latch circuit is connected to the output end of the command input component, and an output end of the command latch circuit is connected to the input end of the command decoding circuit, and wherein the command latch circuit is configured to latch the command signal.

13. A pulse signal generation method, comprising:
providing a clock signal;
performing frequency division on the clock signal by a clock frequency division component to generate a clock frequency division signal;
generating a time delay signal based on the clock frequency division signal by a time delay component; and
receiving the clock frequency division signal and the time delay signal by a selection component at the same time, and performing selection on the clock frequency division signal and the time delay signal according to a preset condition to generate a pulse signal.

14. The pulse signal generation method according to claim 13, wherein the preset condition is as follows: selecting a later rising edge in a rising edge of the clock frequency division signal and a rising edge of the time delay signal as a rising edge of the pulse signal, and selecting an earlier falling edge in a falling edge of the clock frequency division signal and a falling edge of the time delay signal as a falling edge of the pulse signal.

15. The pulse signal generation method according to claim 14, wherein the generating a time delay signal based on the clock frequency division signal by a time delay component, comprises:
outputting a setting pulse by a setting circuit in response to receiving the rising edge of the clock frequency division signal;
outputting a triggering level by a trigger in response to receiving the setting pulse;
delaying the triggering level by a time delay circuit and outputting a delayed triggering level; and
outputting a reset pulse by a reset circuit in response to receiving a rising edge of the delayed triggering level, thereby generating the time delay signal.

16. The pulse signal generation method according to claim 13, further comprising:
adjusting a phase of the clock frequency division signal by a phase adjusting circuit to synchronize a rising edge of the clock frequency division signal and a rising edge of the time delay signal,
wherein receiving the clock frequency division signal and the time delay signal by the selection component at the same time, and performing selection on the clock frequency division signal and the time delay signal according to a preset condition, to generate a pulse signal, comprises:
selecting a rising edge of the clock frequency division signal or a rising edge of the time delay signal as a rising edge of the pulse signal, and selecting an earlier falling edge in a falling edge of the clock frequency division signal and a falling edge of the time delay signal as a falling edge of the pulse signal, to generate the pulse signal.

17. A memory, comprising the pulse signal generation circuit according to claim 1.

* * * * *